United States Patent
Urushihata et al.

(10) Patent No.: US 10,784,186 B2
(45) Date of Patent: *Sep. 22, 2020

(54) SEMICONDUCTOR MODULE

(71) Applicant: KATOH ELECTRIC CO., LTD., Minamitsuru-gun (JP)

(72) Inventors: Hiroyoshi Urushihata, Hanno (JP); Takashi Shigeno, Hanno (JP); Eiki Ito, Hanno (JP); Wataru Kimura, Hanno (JP); Hirotaka Endo, Fujiyoshida (JP); Toshio Koike, Fujiyoshida (JP); Toshiki Kouno, Fujiyoshida (JP)

(73) Assignee: KATOH ELECTRIC CO., LTD., Minamitsuru-gun (JP)

( * ) Notice: Subject to any disclaimer, the term of this patent is extended or adjusted under 35 U.S.C. 154(b) by 32 days.

This patent is subject to a terminal disclaimer.

(21) Appl. No.: 16/162,082

(22) Filed: Oct. 16, 2018

(65) Prior Publication Data

US 2019/0371709 A1 Dec. 5, 2019

Related U.S. Application Data

(62) Division of application No. 16/093,037, filed as application No. PCT/JP2018/020474 on May 29, 2018, now Pat. No. 10,600,725.

(51) Int. Cl.
*H01L 23/495* (2006.01)
*H01L 23/31* (2006.01)
(Continued)

(52) U.S. Cl.
CPC ........ *H01L 23/49503* (2013.01); *H01L 23/10* (2013.01); *H01L 23/3114* (2013.01);
(Continued)

(58) Field of Classification Search
CPC ............. H01L 23/49503; H01L 23/495; H01L 23/49541; H01L 24/36; H01L 24/34
See application file for complete search history.

(56) References Cited

U.S. PATENT DOCUMENTS 5,594,234 A * 1/1997 Carter, Jr. ......... H01L 23/49503
257/676
5,977,630 A * 11/1999 Woodworth ........ H01L 23/4334
257/666

(Continued)

FOREIGN PATENT DOCUMENTS

CN 101290920 A 10/2008
JP 6-260572 A 9/1994
(Continued)

OTHER PUBLICATIONS

Netherlands Search Report dated Apr. 17, 2019 in Netherlands Patent Application No. 2021767, citing documents AA, AB and AC therein, 8 pages.

(Continued)

*Primary Examiner* — David A Zarneke
(74) *Attorney, Agent, or Firm* — Oblon, McClelland, Maier & Neustadt, L.L.P.

(57) ABSTRACT

A semiconductor module includes a die pad frame; a semiconductor chip disposed in a chip region on an upper surface of the die pad frame, the semiconductor chip having an upper surface on which a first electrode is disposed and a lower surface on which a second electrode is disposed; a conductive connection member for die pad disposed between the second electrode of the semiconductor chip and the upper surface of the die pad frame, the conductive connection member for die pad electrically connecting the second electrode of the semiconductor chip and the upper surface of the die pad frame; a first clip frame disposed on the upper surface of the semiconductor chip; a first clip (Continued)

conductive connection member disposed between the first electrode on the semiconductor chip and a lower surface of the first clip frame, the first clip conductive connection member electrically connecting the first electrode of the semiconductor chip and the lower surface of the first clip frame; and a sealing resin for sealing the semiconductor chip, the die pad frame, the first clip frame, the first clip conductive connection member, and the conductive connection member for die pad.

10 Claims, 9 Drawing Sheets

(51) Int. Cl.
*H01L 23/10* (2006.01)
*H01L 23/532* (2006.01)
(52) U.S. Cl.
CPC ...... *H01L 23/3142* (2013.01); *H01L 23/4951* (2013.01); *H01L 23/49541* (2013.01); *H01L 23/49562* (2013.01); *H01L 23/49575* (2013.01); *H01L 23/53233* (2013.01)

(56) References Cited

U.S. PATENT DOCUMENTS

| | | | | |
|---|---|---|---|---|
| 6,197,615 B1* | 3/2001 | Song | ................ | H01L 23/49503 438/111 |
| 6,329,706 B1* | 12/2001 | Nam | ................ | H01L 23/49503 257/666 |
| 6,437,427 B1* | 8/2002 | Choi | ................ | H01L 23/49503 257/666 |
| 6,459,147 B1 | 10/2002 | Crowley et al. | | |
| 6,506,630 B2* | 1/2003 | Mastboom | .......... | H01L 21/4842 257/E23.004 |
| 6,630,726 B1 | 10/2003 | Crowley et al. | | |
| 6,873,041 B1 | 3/2005 | Crowley et al. | | |
| 7,285,849 B2* | 10/2007 | Cruz | ................ | H01L 21/561 257/690 |
| 7,327,017 B2* | 2/2008 | Sirinorakul | ........... | H01L 23/495 257/666 |
| 7,838,973 B2* | 11/2010 | Dimasacat | .............. | H01L 24/83 257/676 |
| 7,911,054 B2* | 3/2011 | Hasebe | ................ | H01L 21/563 257/730 |
| 8,395,364 B2* | 3/2013 | Sato | ................... | H01L 23/4952 323/282 |
| 8,692,370 B2* | 4/2014 | Kitazawa | .......... | H01L 23/49503 257/738 |
| 8,692,730 B2* | 4/2014 | Shimizu | ................ | H01Q 1/246 343/758 |
| 8,956,920 B2* | 2/2015 | Wu | ................... | H01L 23/49503 257/676 |
| 9,013,028 B2* | 4/2015 | Lee | ................... | H01L 23/49503 257/666 |
| 9,406,592 B2* | 8/2016 | Kohl | ........ | H01L 24/33 |
| 9,515,009 B2* | 12/2016 | Fen | .................... | H01L 21/4825 |
| 9,536,800 B2* | 1/2017 | Ashrafzadeh | ........... | H01L 24/97 |
| 9,620,438 B2* | 4/2017 | Duca | ................... | H01L 23/4334 |
| 9,666,501 B2* | 5/2017 | Haga | .................. | H01L 23/3121 |
| 9,831,158 B2* | 11/2017 | Hayashi | ............ | H01L 23/49541 |
| 10,083,866 B2* | 9/2018 | Bin Mohd Arshad | ...................... | H01L 23/49548 |
| 10,104,775 B2* | 10/2018 | Yoshimatsu | ........... | H05K 3/284 |
| 10,304,761 B2* | 5/2019 | Kawano | .............. | H01L 23/3135 |
| 10,340,208 B2* | 7/2019 | Haga | ................ | H01L 23/49513 |
| 10,515,880 B2* | 12/2019 | Yao | ........................ | H01L 24/48 |
| 2002/0125562 A1 | 9/2002 | Crowley et al. | | |
| 2005/0224925 A1* | 10/2005 | Chou | ...................... | H01L 24/40 257/666 |
| 2006/0097366 A1* | 5/2006 | Sirinorakul | ........... | H01L 23/495 257/666 |
| 2009/0294932 A1* | 12/2009 | Sahasrabudhe | ... | H01L 23/49503 257/666 |
| 2009/0294935 A1 | 12/2009 | Tay et al. | | |
| 2011/0108968 A1 | 5/2011 | Hu et al. | | |
| 2012/0068318 A1* | 3/2012 | Camacho | ............ | H01L 21/4832 257/676 |
| 2012/0086112 A1* | 4/2012 | Amaro | .................. | H01L 23/495 257/674 |
| 2014/0124912 A1* | 5/2014 | Kaneda | ................... | H01L 24/49 257/676 |
| 2014/0284783 A1* | 9/2014 | Sayama | .................. | H01L 23/34 257/690 |
| 2015/0279767 A1 | 10/2015 | Lee et al. | | |
| 2016/0163622 A1* | 6/2016 | Liang | ..................... | H01L 25/50 257/676 |
| 2016/0172266 A1* | 6/2016 | Kadoguchi | ......... | H01L 23/3107 257/717 |
| 2016/0207148 A1* | 7/2016 | Kobayashi | ......... | B23K 26/0006 |
| 2016/0233150 A1 | 8/2016 | Fukui | | |
| 2016/0293563 A1* | 10/2016 | Fujino | .................... | H01L 24/36 |
| 2016/0315054 A1 | 10/2016 | Kajihara et al. | | |
| 2017/0018495 A1 | 1/2017 | Fujino et al. | | |
| 2017/0207150 A1* | 7/2017 | Choi | ................. | H01L 23/49562 |
| 2017/0263537 A1 | 9/2017 | Suzuhara | | |
| 2017/0317036 A1* | 11/2017 | Myers | ................. | H01L 23/3114 |
| 2018/0197802 A1 | 7/2018 | Nagamatsu et al. | | |
| 2019/0198454 A1* | 6/2019 | Talledo | ............... | H01L 21/4828 |
| 2019/0355652 A1* | 11/2019 | Chou | .................. | H01L 23/3107 |

FOREIGN PATENT DOCUMENTS

| | | |
|---|---|---|
| JP | 2008-311366 A | 12/2008 |
| JP | 2016-149516 A | 8/2016 |
| TW | 201023309 A1 | 6/2010 |
| WO | WO 2012/013161 A1 | 2/2012 |
| WO | WO 2015/178296 A1 | 11/2015 |
| WO | WO 2016/067414 A1 | 5/2016 |
| WO | WO 2017/169485 A1 | 10/2017 |

OTHER PUBLICATIONS

Netherlands Search Report dated Apr. 17, 2019 in Netherlands Patent Application No. 2021814, citing documents AA, AB, AD, AE and AO therein, 8 pages.
International Search Report dated Aug. 14, 2018, PCT/JP2018/020474 filed May 29, 2018.
Combined Taiwanese Office Action and Search Report dated May 2, 2019 in Taiwanese Patent Application No. 107134364 (with English translation of Office Action only), citing documents AO, AP and AQ therein, 4 pages.
Combined Taiwanese Office Action and Search Report dated Apr. 12, 2019 in Taiwanese Patent Application No. 107136422 (with English translation of Office Action only), citing documents AA through AE therein, 12 pages.
Taiwanese Office Action dated Dec. 10, 2019, in Patent Application No. 107136422, 13 pages (with English translation).

* cited by examiner

SEMICONDUCTOR MODULE

CROSS-REFERENCE TO RELATED APPLICATIONS

This application is a divisional application of and claims the benefit of priority under 35 U.S.C. § 120 from U.S. application Ser. No. 16/093,037, filed on Oct. 11, 2018, which is a U.S. national stage application under 35 U.S.C. § 371 of PCT/JP2018/020474, filed on May 29, 2018, the entire contents of each of which are incorporated herein by reference.

JOINT RESEARCH AGREEMENT

The subject matter claimed was made as a result of activities undertaken within the scope of a joint research agreement. The parties to the joint research agreement are Shindengen Electric Manufacturing Co., Ltd. and Katoh Electric Co., Ltd.

TECHNICAL FIELD

The present invention relates to semiconductor modules.

BACKGROUND ART

Conventionally known semiconductor modules may include a semiconductor chip, a lead frame electrically connected to the semiconductor chip by a bonding wire, a sealing resin for sealing the semiconductor chip and the lead frame, and a die pad frame connected to the semiconductor chip by a bonding agent or the like (for example, see JP H06-260572 A and JP 2008-311366 A).

Such a semiconductor module has a protrusion at an end portion of the die pad frame to improve the adhesion between the sealing resin and the die pad frame.

The semiconductor module, however, has a problem of a crack K and a separation of the sealing resin H caused at the end portion of the die pad frame DF on which the semiconductor chip is disposed (FIGS. 14 and 15).

An end portion of a clip frame CF1 disposed above the semiconductor chip CX in the semiconductor module needs to be insulated from the semiconductor chip CX.

The end portion of the clip frame CF1 disposed above the semiconductor chip CX also have a problem of a crack Q caused to the sealing resin H near the end portion (FIG. 15).

DISCLOSURE OF THE INVENTION

Problem to be Solved by the Invention

Under the circumstance, it is an object of the present invention to provide a semiconductor module capable of preventing occurrence of a crack or a separation of a sealing resin while improving insulation between a clip frame and a semiconductor chip in an area at an end portion of the clip frame that is disposed above the semiconductor chip.

Solution to Problem

A semiconductor module, according to an embodiment of an aspect of the present invention, comprising:
a die pad frame;
a semiconductor chip disposed in a chip region on an upper surface of the die pad frame, the semiconductor chip having an upper surface on which a first electrode is disposed and a lower surface on which a second electrode is disposed;
a conductive connection member for die pad disposed between the second electrode of the semiconductor chip and the upper surface of the die pad frame, the conductive connection member for die pad electrically connecting the second electrode of the semiconductor chip and the upper surface of the die pad frame;
a first clip frame disposed on the upper surface of the semiconductor chip;
a first clip conductive connection member disposed between the first electrode on the semiconductor chip and a lower surface of the first clip frame, the first clip conductive connection member electrically connecting the first electrode of the semiconductor chip and the lower surface of the first clip frame; and
a sealing resin for sealing the semiconductor chip, the die pad frame, the first clip frame, the first clip conductive connection member, and the conductive connection member for die pad,
wherein a dip locking part is disposed at an end portion of an upper surface of the first clip frame, the clip locking part being partially above the upper surface of the first clip frame so as to be away from the upper surface of the semiconductor chip, and
wherein a groove is formed on a lower surface of the clip locking part.

In the semiconductor module,
wherein a cross section of the groove perpendicularly taken relative to a length direction of the groove, along which the groove extends on the lower surface of the clip locking part, has a V shape.

In the semiconductor module,
wherein the groove on the lower surface of the clip locking part is formed by laser irradiation or pressing.

In the semiconductor module,
wherein the groove on the lower surface of the clip locking part is disposed around a perimeter of the end portion of the upper surface of the first clip frame.

In the semiconductor module,
wherein the clip locking part is continuously disposed around the perimeter of the end portion of the upper surface of the first clip frame.

In the semiconductor module,
wherein two or more grooves are formed on the lower surface of the clip locking part around the perimeter of the end portion of the upper surface of the first clip frame.

In the semiconductor module,
wherein the clip locking part has a protruding part that protrudes from the end portion of the upper surface of the first clip frame.

In the semiconductor module,
wherein the clip locking part has two or more protruding part that protrude from the end portion of the upper surface of the first dip frame in a stepwise manner.

In the semiconductor module,
wherein an end of the clip locking part has a rectangular shape or a curved shape.

In the semiconductor module,
wherein the clip locking part is formed by pressing the end portion of the upper surface of the first clip frame upward.

In the semiconductor module,
wherein the sealing resin has a linear expansion coefficient that is smaller than the linear expansion coefficient of the die pad frame and the first clip frame, and greater than the linear expansion coefficient of the semiconductor chip.

In the semiconductor module,
wherein a third electrode that has a smaller upper surface area than the first electrode is disposed on the upper surface of the semiconductor chip, and
wherein the semiconductor module further comprises:
a second clip frame that is disposed on the upper surface of the semiconductor chip to be adjacent to the first clip frame, the second clip frame having a smaller upper surface area than the first clip frame; and
a second clip conductive connection member electrically connecting the third electrode of the semiconductor chip and a lower surface of the second clip frame.

In the semiconductor module,
wherein the semiconductor chip is an MOS transistor,
wherein the first electrode is a source electrode of the MOS transistor,
wherein the second electrode is a drain electrode of the MOS transistor, and
wherein the third electrode is a gate electrode of the MOS transistor.

In the semiconductor module,
wherein the first clip conductive connection member, the second clip conductive connection member, and the conductive connection member for die pad are soldering material members.

In the semiconductor module,
wherein the die pad frame has a protrusion disposed on an upper side of an end portion of a main body of the die pad frame and protruding from an upper surface of the main body of the die pad frame in a direction parallel to a direction in which the upper surface of the main body of the die pad frame extends, the protrusion improving adhesion with the sealing resin, and
wherein a locking portion is disposed on a tip portion of the protrusion, the locking portion being partially above an upper surface of the protrusion.

In the semiconductor module,
wherein the protrusion of the die pad frame has one or more laser grooves on the upper surface, the one or more grooves being formed by laser irradiation so as to extend along the end portion of the main body of the die pad frame.

In the semiconductor module,
wherein the one or more laser grooves on the upper surface of the protrusion have a cross section taken along a direction perpendicular to a length direction along which the one or more laser grooves extend, the cross section having a V shape or a U shape, and
wherein a bottom of a first laser groove among the one or more laser grooves is positioned to be closer to a chip region where the semiconductor chip is disposed than a center of a width of the first laser groove.

In the semiconductor module,
wherein a direction of the laser irradiation relative to a groove region of the upper surface of the protrusion where the first laser groove is formed is slanted from a perpendicular line passing through the groove region of the upper surface of the projection toward the locking portion.

In the semiconductor module,
wherein the one or more laser grooves on the upper surface of the protrusion have a cross section taken along a direction perpendicular to a length direction in which the one or more the laser grooves extend, the cross section having a V shape or a U shape, and wherein a bottom of a second laser groove among the one or more laser groove is positioned to be closer to the locking portion than a center of a width of the second laser groove.

In the semiconductor module,
wherein a direction of the laser irradiation relative to the groove region of the upper surface of the protrusion where the second laser groove is formed is slanted from a perpendicular line passing through the groove region of the upper surface of the protrusion toward the chip region where the semiconductor chip is disposed.

In the semiconductor module,
wherein the laser irradiation roughens inner surfaces and edge portions of the one or more laser grooves to prevent the conductive connection member for die pad on the upper surface of the die pad frame from spreading by getting wet.

In the semiconductor module,
wherein the die pad frame has a first side, a second side, one end of which intersects one end of the first side, a third side, one end of which intersects another end of the first side, and a fourth side, one end of which intersects another side of the second side and another side of which intersects another end of the third side,
wherein the protrusion and the locking portion are formed in a region along the first side, the second side, and the third side, and not formed in a region along the fourth side,
wherein the region along the fourth side of the upper surface of the die pad frame has a through-hole passing through the main body and improving adhesion with the sealing resin,
wherein the one or more laser grooves are formed by the laser irradiation on the upper surface of the protrusion along the first side, the second side, and the third side of the die pad frame, and
wherein one or more additional laser grooves are formed by laser irradiation along the fourth side between the region where the through-hole is formed and the chip region.

In the semiconductor module,
wherein the one or more laser grooves are sequentially disposed along the first side, the second side, and the third side of the die pad frame, and
wherein the number of additional laser grooves is greater than the number of lines formed by the one or more laser grooves.

In the semiconductor module,
wherein the one or more laser grooves are in communication with the one or more additional laser groove to surround a perimeter of the chip region of the die pad frame where the semiconductor chip is disposed.

In the semiconductor module,
wherein a conductive metal material of the die pad frame is a copper-based alloy or a copper-based alloy to which a different metal selected from Sn, Zn, Fe, Cr, and Ni is added, and wherein a surface of the die pad frame are not plated.

In the semiconductor module,
wherein a difference in height between the lower surface of the locking portion and the lower surface of the protrusion is greater than a difference in height between the upper surface of the locking portion and the upper surface of the protrusion.

In the semiconductor module,
wherein the lower surface of the locking portion slopes upward to an end portion of the locking portion.

In the semiconductor module,
wherein the lower surface of the clip locking part slopes upward to an end of the clip locking part.

In the semiconductor module, wherein an upper surface of the clip locking part slopes downward to the end of the clip locking part.

In the semiconductor module, wherein an end the portion of a lower surface of the protrusion connecting to a lower surface of the locking portion has a curved shape.

In the semiconductor module, wherein an end portion of a lower surface of the locking portion has a curved shape.

Effects of the Invention

A semiconductor module in an aspect of the present invention includes:

a die pad frame;

a semiconductor chip disposed in a chip region on an upper surface of the die pad frame, the semiconductor chip having an upper surface on which a first electrode is disposed and a lower surface on which a second electrode is disposed;

a conductive connection member for die pad disposed between the second electrode of the semiconductor chip and an upper surface of the die pad frame, the conductive connection member for die pad electrically connecting the second electrode of the semiconductor chip and the upper surface of the die pad frame;

a first clip frame disposed on the upper surface of the semiconductor chip;

a first clip conductive connection member disposed between the first electrode on the semiconductor chip and a lower surface of the first clip frame, the first clip conductive connection member electrically connecting the first electrode of the semiconductor chip and the lower surface of the first clip frame; and a sealing resin for sealing the semiconductor chip, the die pad frame, the first clip frame, the first clip conductive connection member, and the conductive connection member for die pad.

A clip locking part is disposed at an end portion of an upper surface of the first clip frame, the clip locking part being partially above the upper surface of the first clip frame so as to be away from the upper surface of the semiconductor chip.

A groove is formed on a lower surface of the clip locking part.

Since the end portion of the first clip frame is separated from the semiconductor chip, the end portion of the first clip frame may be sufficiently insulated with respect to the semiconductor chip.

In a region near the clip locking part at the end portion of the first clip frame, the groove of the clip locking part prevents the sealing resin from shrinking, and in turn prevents the occurrence of a crack or a separation to the sealing resin.

Thus, the semiconductor module according to the present invention is capable of improving the insulation between the semiconductor chip and the clip frame disposed on the semiconductor chip in a region near the end portion or the clip frame, while preventing the sealing resin from cracking or separating.

EMBODIMENTS FOR CARRYING OUT THE INVENTION

Embodiments of the present invention will now be described with reference the accompanying drawings.

First Embodiment

Figure 1:
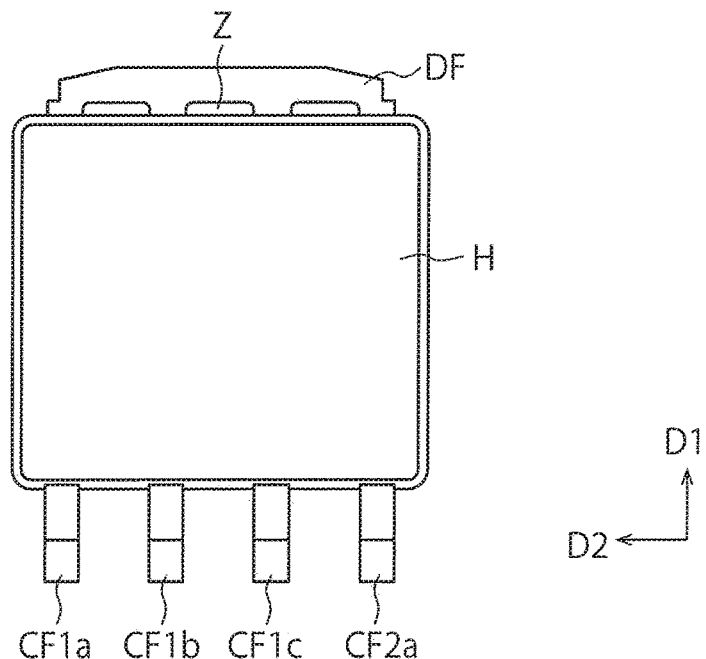
FIG. 1 shows a top view illustrating an example of an external appearance of a semiconductor module 100 according to a first embodiment.
Figure 2:
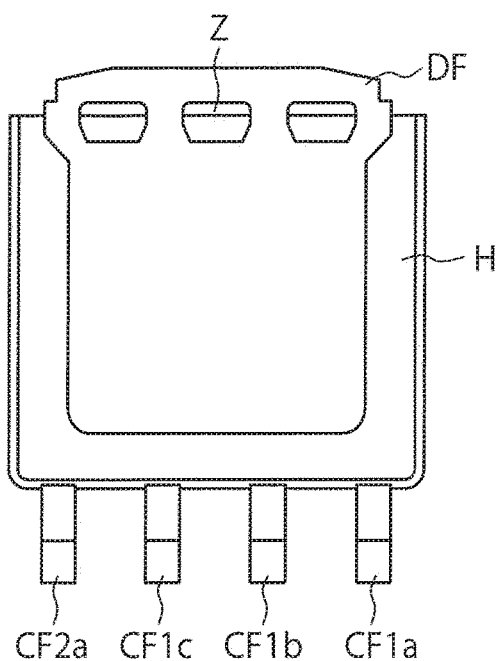
FIG. 2 is a bottom view of the example of the external appearance of the semiconductor module 100 shown in FIG. 1.
Figure 3:
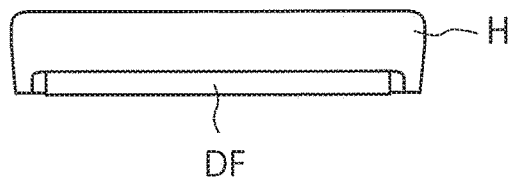
FIG. 3 is a side view of the example of the external appearance of the semiconductor module 100 shown in FIG. 1 viewed from a direction that is opposite to a first direction D1.
Figure 4:
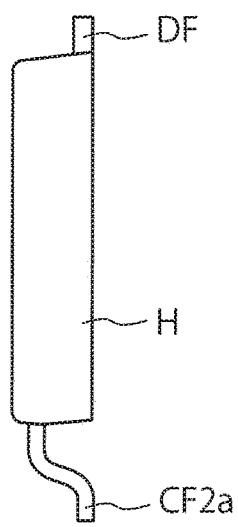
FIG. 4 is a side view of the example of the external appearance of the semiconductor module 100 shown in FIG. 1, viewed from a second direction D2.
Figure 5:
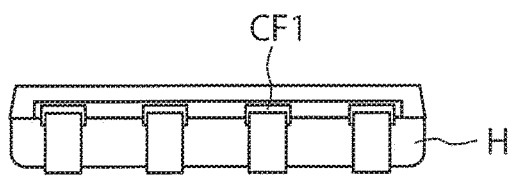
FIG. 5 is a side view of the example of the external appearance of the semiconductor module 100 shown in FIG. 1 viewed from the first direction D1.
Figure 6:
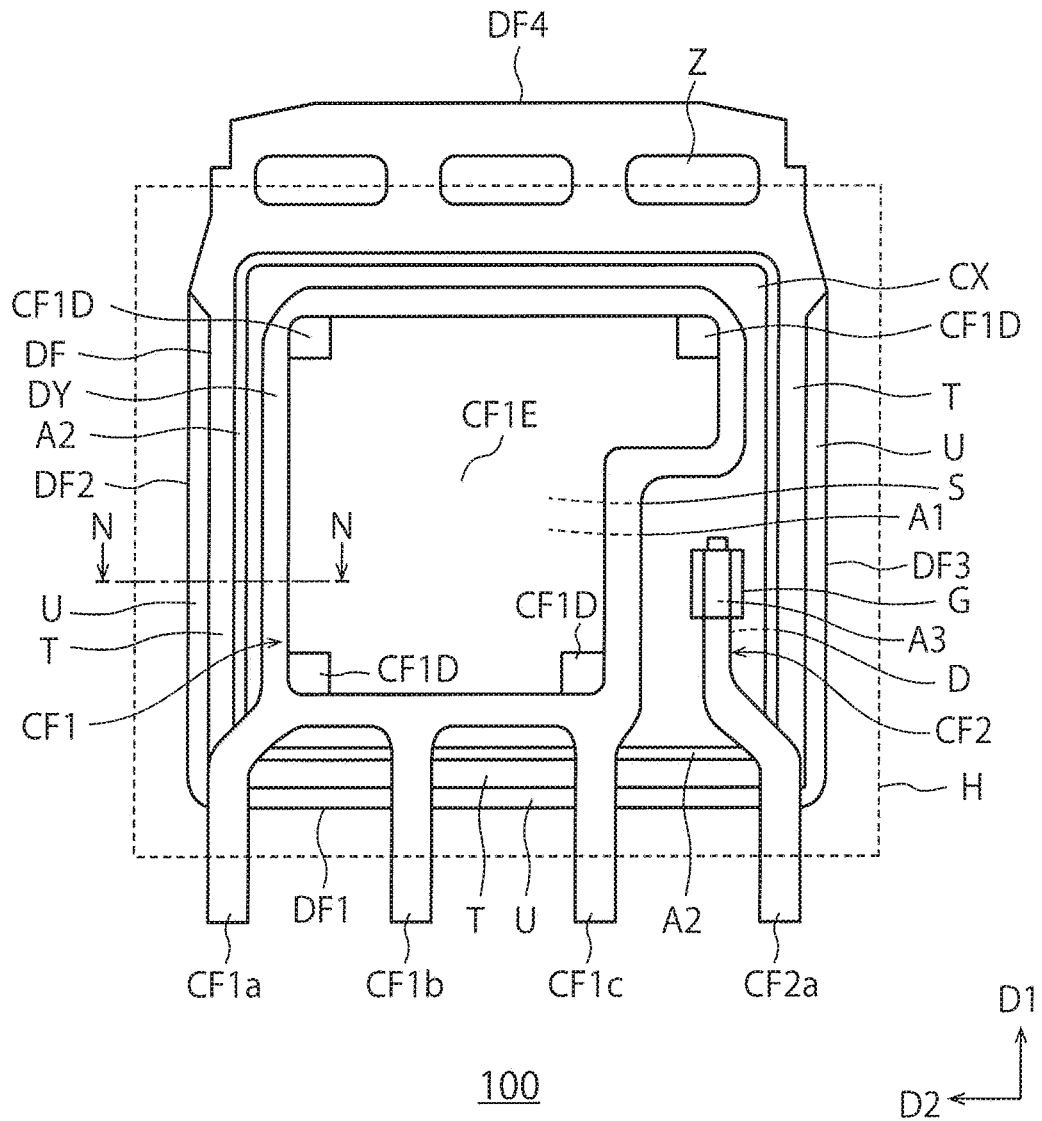
FIG. 6 is a top view illustrating an example of an internal appearance of the semiconductor module 100 shown in FIG. 1.
Figure 7:
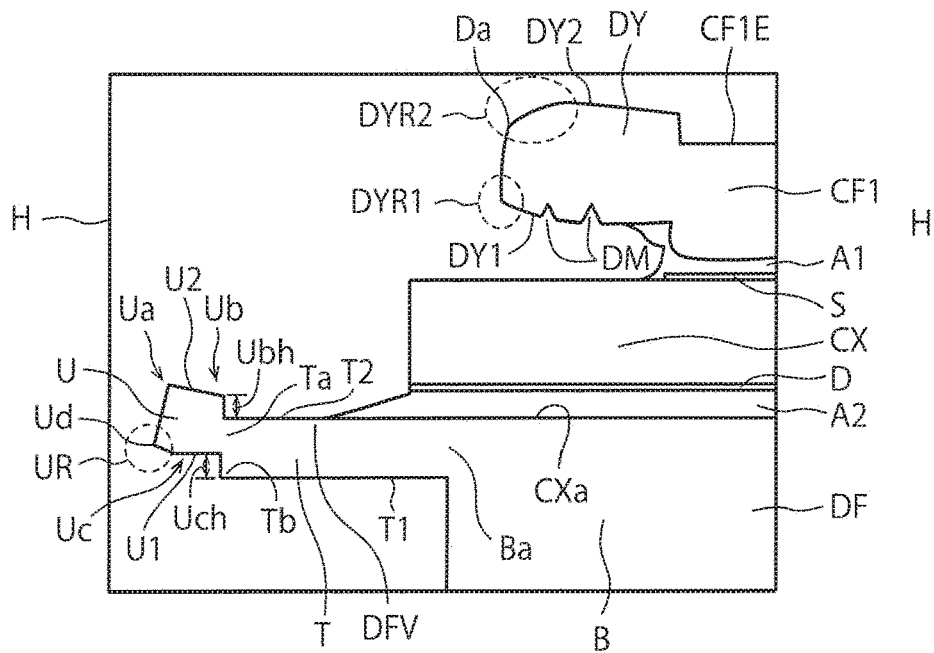
FIG. 7 is a cross-sectional view illustrating an example of a cross section of the semiconductor module shown in FIG. 6 taken along line N-N.
Figure 8:
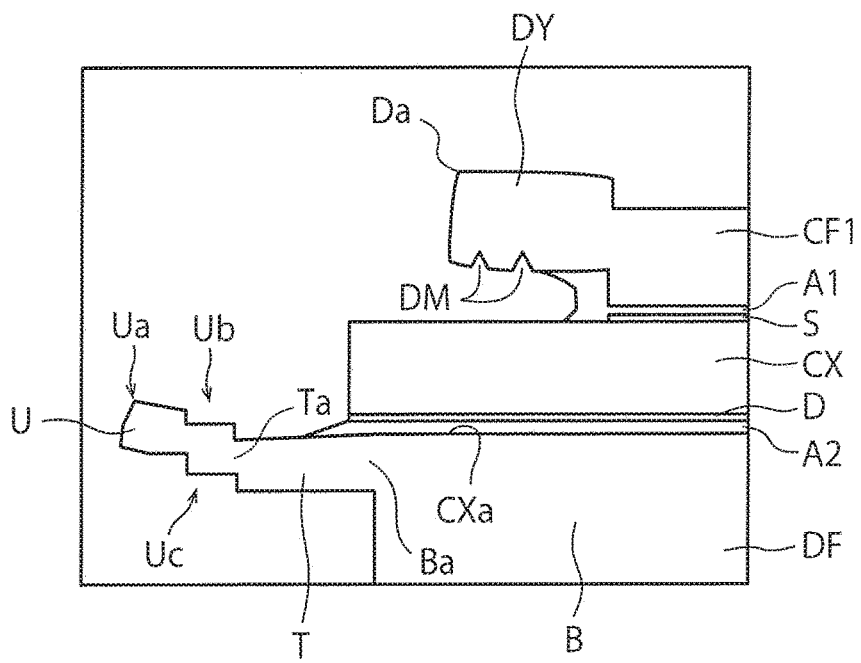
FIG. 8 is a cross-sectional view illustrating another example of the cross section of the semiconductor module shown in FIG. 6 taken along line N-N.

FIG. 1 shows a top view illustrating an example of an external appearance of a semiconductor module 100 according to a first embodiment. FIG. 2 is a bottom view of the example of the external appearance of the semiconductor module 100 shown in FIG. 1. FIG. 3 is a side view of the example of the external appearance of the semiconductor module 100 shown in FIG. 1 viewed from a direction that is opposite to a first direction D1. FIG. 4 is a side view of the example of the external appearance of the semiconductor module 100 shown in FIG. 1, viewed from a second direction D2. FIG. 5 is a side view of the example of the external appearance of the semiconductor module 100 shown in FIG. 1 viewed from the first direction D1. FIG. 6 is a top view illustrating an example of an internal appearance of the semiconductor module 100 shown in FIG. 1. FIG. 7 is a cross-sectional view illustrating an example of a cross section of the semiconductor module shown in FIG. 6 taken along line N-N. FIG. 8 is a cross-sectional view illustrating another example of the cross section of the semiconductor module shown in FIG. 6 taken along line N-N. In FIG. 6, the sealing member A is illustrated as a transparent member.

As shown in FIGS. 1 to 8, for example, the semiconductor module 100 according to the first embodiment includes a die pad frame (lead frame) DF, a semiconductor chip CX, a conductive connection member for die pad A2, a sealing resin H, a first clip frame CF1, a first clip conductive connection member A1, a second clip frame CF2, and a second clip conductive connection member A3.

In this embodiment, the semiconductor module 100 functions as a three-terminal semiconductor device (MOS transistor).

The semiconductor chip CX is disposed in a chip region CXa on an upper surface of the die pad frame DF.

A first electrode (source electrode) S is disposed on an upper surface, and a second electrode (drain electrode) D is disposed on a lower surface of the semiconductor chip CX. A third electrode (gate electrode) G that has a smaller upper surface area than the first electrode S is also disposed on the upper surface of the semiconductor chip CX.

In this embodiment, the semiconductor chip CX is a MOS transistor, for example. In this case, the first electrode S is a source electrode of the MOS transistor, the second electrode D is a drain electrode of the MOS transistor, and the third electrode G is a gate electrode of the MOS transistor.

The conductive connection member for die pad A2 is disposed between the second electrode D of the semiconductor chip CX and the upper surface of the die pad frame DF.

The conductive connection member for die pad A2 electrically connects the second electrode D of the semiconductor chip CX and the upper surface of the die pad frame DF.

The conductive connection member for die pad A2 is, for example, a soldering material member.

As shown in FIGS. 6 and 7, for example, the first clip frame CF1 is disposed on the upper surface of the semiconductor chip CX.

The first clip frame CF1 has terminals CF1a, CF1b, and CF1c protruding from the sealing resin H, as shown in FIGS. 1 to 6, for example.

The first clip frame CF1 has an upper surface CF1E, at an end of which a clip locking part DY is disposed. A part of the clip locking part DY protrudes from the upper surface of the semiconductor chip CX so as to be above the upper surface CF1E of the first clip frame CF1, as shown in FIGS. 6 and 7, for example.

The clip locking part DY performs a mold lock of the sealing resin H near the end of the upper surface CF1E of the first clip frame CF1.

In particular in FIGS. 7 and 8, the lower surface of the clip locking part DY has grooves DM.

The cross section of the grooves DM taken along a line that is perpendicular to a direction along which the grooves DM extend on the lower surface of the clip locking part DY has a V shape.

The grooves DM are formed by laser irradiation or pressing on the lower surface of the clip locking part DY.

The grooves DM on the lower surface of the clip locking part DY extend along the perimeter of the upper surface CF1E of the first dip frame CF1. The dip locking part DY continuously surrounds the perimeter of the upper surface CF1E of the first dip frame CF1.

As shown in FIGS. 7 and 8, for example, the multiple grooves DM are disposed to be parallel to each other on the lower surface of the dip locking part DY along the perimeter of the upper surface CF1E of the first clip frame CF1.

Although there are two groove DMs in the example shown in FIGS. 7 and 8, the number of grooves DM may be one, or three or more.

The clip locking part DY may have a protruding part (step) that protrudes from the end of the upper surface CF1E of the first clip frame CF1.

The clip locking part DY may have two or more protruding parts (steps) that protrude from the end of the upper surface CF1E of the first clip frame CF1 in a stepwise manner.

An end Da of the clip locking part DY may have a rectangular shape or a curved shape.

The clip locking part DY may be formed by pressing up the end portion of the upper surface CF1E of the first clip frame CF1, for example.

The first clip frame CF1 has four projecting portions (dowel portions) CF1D formed by pressing the first clip frame CF1 from above, as shown in FIG. 6, for example. The four projecting portions CF1D are in contact with the first electrode (source electrode) S on the upper surface of the semiconductor chip CX directly or via the first clip conductive connection member A1.

The first dip conductive connection member A1 is disposed between the first electrode S of the semiconductor chip CX and the lower surface of the first clip frame CF1, as shown in, for example, FIGS. 7 and 8.

The first dip conductive connection member A1 electrically connects the first electrode S of the semiconductor chip CX and the lower surface of the first clip frame CF1.

The first clip conductive connection member A1 is a soldering material member, for example.

The second clip frame CF2 is disposed on the upper surface of the semiconductor chip CX to be adjacent to the first clip frame CF1.

The second clip frame CF2 has a terminal CF2a protruding from the sealing resin H.

The second clip frame CF2 has a smaller upper surface area than the first clip frame CF1.

The second clip conductive connection member A3 electrically connects the third electrode G of the semiconductor chip CX and the lower surface of the second clip frame CF2.

The second clip conductive connection member A3 is a soldering material member, for example.

The sealing resin H seals the semiconductor chip CX, the die pad frame DF, the first clip frame CF1, the first clip conductive connection member A1, the second clip frame CF2, the second clip conductive connection member A3, and the conductive connection member for die pad A2.

The linear expansion coefficient of the sealing resin H is set to be smaller than that of the die pad frame DF and the first clip frame CF1, and greater than that of the semiconductor chip CX, for example.

The die pad frame (lead frame) DF has a first side DF1, a second side DF2, one end of which intersects one end of the first side DF1, a third side DF3, one end of which intersects the other end of the first side DF1, and a fourth side DF, one end of which intersects the other end of the second side DF2 and the other end of which intersects the other end of the third side DF3.

Thus, the die pad frame DF has a substantially rectangular shape.

The die pad frame DF has a projection T intended to improve the adhesion with the sealing resin H.

The projection T is disposed on an upper side of an end Ba of a main body B of the die pad frame DF and protrudes from the upper surface of the main body B of the die pad frame DF in a direction that is parallel to the upper surface of the main body B of the die pad frame DF (for example, a second direction D2), as shown in FIGS. 6 and 7.

With this structure, the projection T may improve the adhesion between the die pad frame DF and the sealing resin H.

The projection T has, at its end, a locking portion U that is partially located above the upper surface of the projection T.

The locking portion U has a step portion Ub that protrudes upward from an upper surface of an end Ta of the projection T, as shown in FIG. 7, for example. The locking portion U may also have a step portion Uc on its lower surface by which the edge portion is raised.

The sealing resin H near the upper surface of the end portion of the projection T may be locked in this manner to complete the mold lock.

The step portion Ub of the locking portion U is formed by pressing upward the end portion of the projection T, for example.

The locking portion U may have two or more step portions Ub that protrude from the upper surface of the end portion Ta of the projection T sequentially (in a stepwise manner). Furthermore, the locking portion U may have two or more step portions Uc that are provided on the lower surface in a stepwise manner.

This allows the sealing resin H around the upper surface of the end portion of the projection T to be locked by the two or more step portions Ub protruding upward from the upper surface of the end portion of the projection T in a stepwise manner to surely complete the mold lock.

The step portions Ub of the locking portion U are formed by pressing the end portion of the projection T several times, for example.

The height of the top part of the locking portion U may be higher than the height of the top part of the conductive connection member for die pad A2 so as to block the flow of the conductive connection member for die pad A2, as shown in FIGS. 7 and 8, for example.

The length of the locking portion U in the direction along which the projection T extends (for example, the second direction D2) is set to be shorter than the length of the projection T excluding the locking portion U, as shown in FIGS. 7 and 8, for example. If necessary, the length of the locking portion U may be longer than the length of the projection T excluding the locking portion U.

An end Ua of the locking portion U has a rectangular shape or a curved shape.

The die pad frame DF is formed of a conductive metal material, which is a copper (Cu)-based alloy or a copper (Cu)-based alloy to which a different metal such as Sn, Zn, Fe, Cr, or Ni is added. Although the surface of the die pad frame DF is not plated, it may be plated if necessary.

This enables the die pad frame DF to be formed easily.

The projection T continuously surrounds the perimeter of the end Ba of the upper surface of the main body B of the die pad frame DF (along the first, second, and third sides DF1, DF2, and DF3) as shown in FIG. 6, for example.

As shown in FIG. 6, the projection T and the locking portion U are disposed in a region along the first, second, and third sides DF1, DF2, and DF3, but not disposed in a region along the fourth side DF4.

Furthermore, as shown in FIG. 6, through-holes Z are disposed in the region of the upper surface of the die pad frame DF along the fourth side DF4, the through-hole Z penetrating the main body B and being intended to improve the adhesion of the die pad frame DF with the sealing resin H.

In the through-hole Z, the thickness of the die pad frame DF on the side sealed by the sealing resin H is the same as the thickness of the projection T (that is a half of the thickness of the central portion of the die pad frame DF). This improves the adhesion of the die pad frame DF and the sealing resin H.

The locking portion U may have the same thickness as the projection T, for example.

The height Uch of the step portion Uc between the lower surface U1 of the locking portion U and the lower surface T1 of the projection T may be greater than the height Ubh of the step portion Ub between the upper surface U2 of the locking portion U and the upper surface T2 of the projection T (FIG. 7).

The lower surface U1 of the locking portion U may slope upward to the end of the locking portion U (the region UR in FIG. 7). This may reduce the stress of the sealing resin H.

The clip locking part DY disposed at the end portion of the upper surface CF1E of the first clip frame CF1 is partially above the upper surface CF1E of the first clip frame CF1 to be away from the upper surface of the semiconductor chip CX. The lower surface DY1 of the clip locking part DY may slope upward to the end of the clip locking part DY (the region DYR1 in FIG. 7). This may improve the insulation between the clip locking part DY and the lower surface DY1 of the semiconductor chip CX further.

The upper surface DY2 of the clip locking part DY may slope downward to the end of the clip locking part DY (the region DYR2 in FIG. 7). This may reduce the stress of the sealing resin H at the end portion of the clip locking part DY and improve the adhesion between the end portion of the clip locking part DY and the sealing resin H.

An end Tb of the lower surface of the projection T connecting to the lower surface U1 of the locking portion U (FIG. 7) may have a curved shape instead of a rectangular shape. This may reduce the stress of the sealing resin H at the end Tb of the projection T.

An end portion Ud of the lower surface U1 of the locking portion U (FIG. 7) may have a curved shape instead of a rectangular shape. This may reduce the stress of the sealing resin H at the end Ud of the locking portion U.

As described above, in the semiconductor module 100 having the above-described structure, the locking portion U at the end of the projection T of the die pad frame may block the conductive connection member for die pad.

The locking portion U may prevent the sealing resin from shrinking in a region near the end of the projection T of the die pad frame, and in turn prevent the sealing resin from cracking or separating.

Thus, the semiconductor module according to the first embodiment is capable of improving the insulation between the semiconductor chip and the clip frame disposed on the semiconductor chip in a region near the end of the clip frame, while preventing the sealing resin from cracking or separating.

Furthermore, the semiconductor module according to the first embodiment is capable of preventing the flow of the conductive connection member that electrically connects the semiconductor chip and the die pad frame in a region at the end of the die pad frame, while preventing the occurrence of a crack or separation of the sealing resin at an end portion of the die pad frame.

Second Embodiment

A second embodiment having a structure in which a laser groove is provided to the upper surface of the projection T of the die pad frame DF included in the semiconductor module will be described below.

Figure 9:
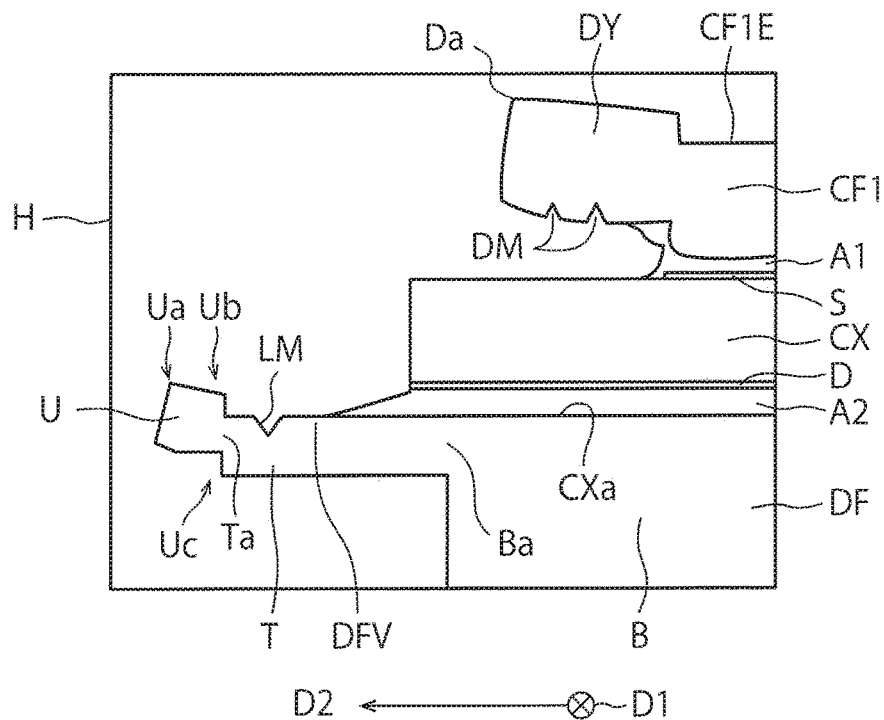
FIG. 9 is a cross-sectional view illustrating an example of a cross section of a semiconductor module according to a second embodiment.
Figure 10:
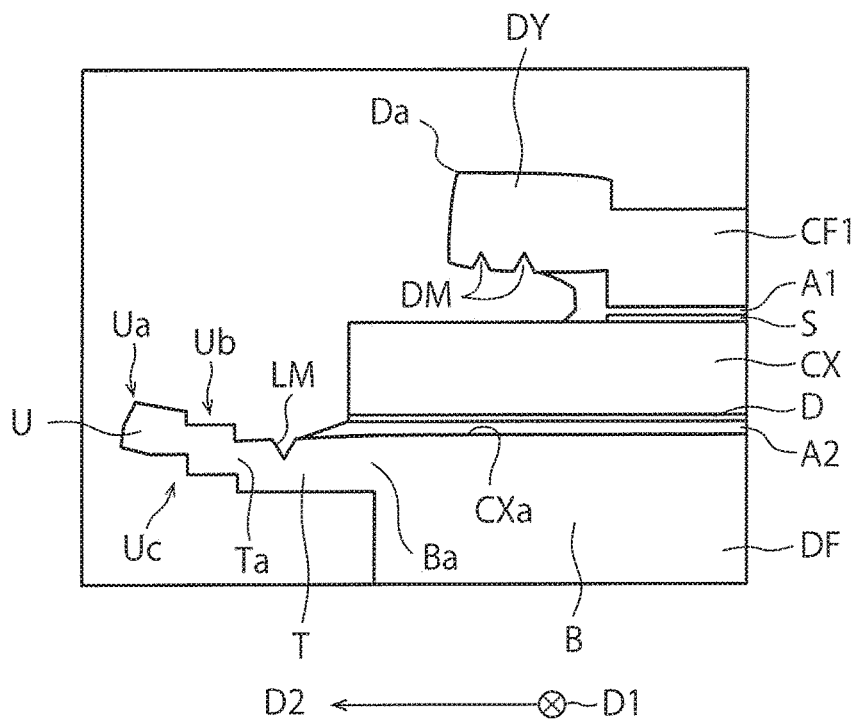
FIG. 10 is a cross-sectional view illustrating another example of the cross section of the semiconductor module according to the second embodiment.
Figure 11:
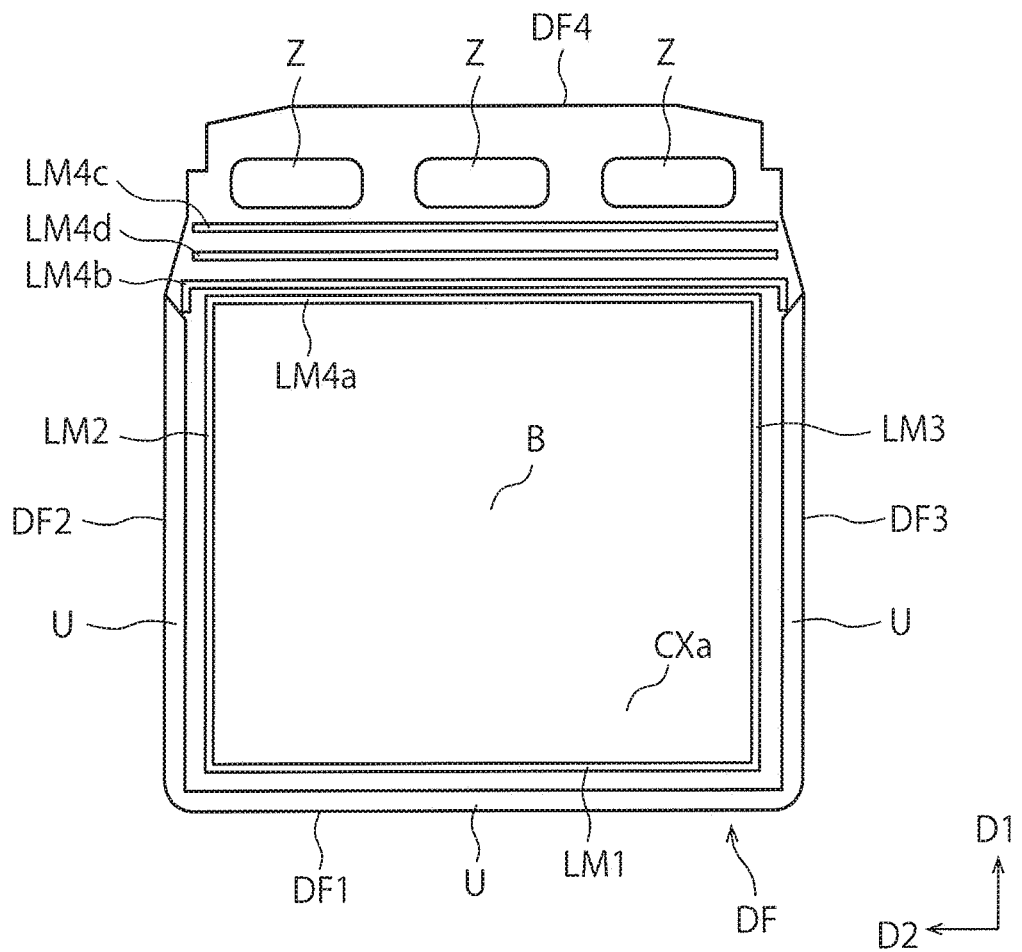
FIG. 11 is a top view illustrating an example of a configuration on an upper surface of a die pad frame DF included in the semiconductor module according to the second embodiment.
Figure 12:
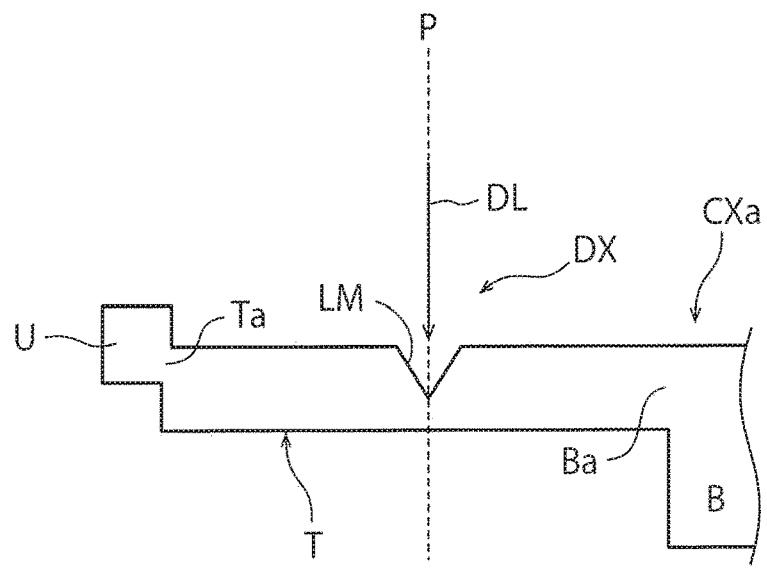
FIG. 12 is a cross-sectional view of the die pad frame DF, illustrating an example of a process of forming a laser groove LM on the upper surface of the projection T of the die pad frame DF by laser irradiation.
Figure 13:
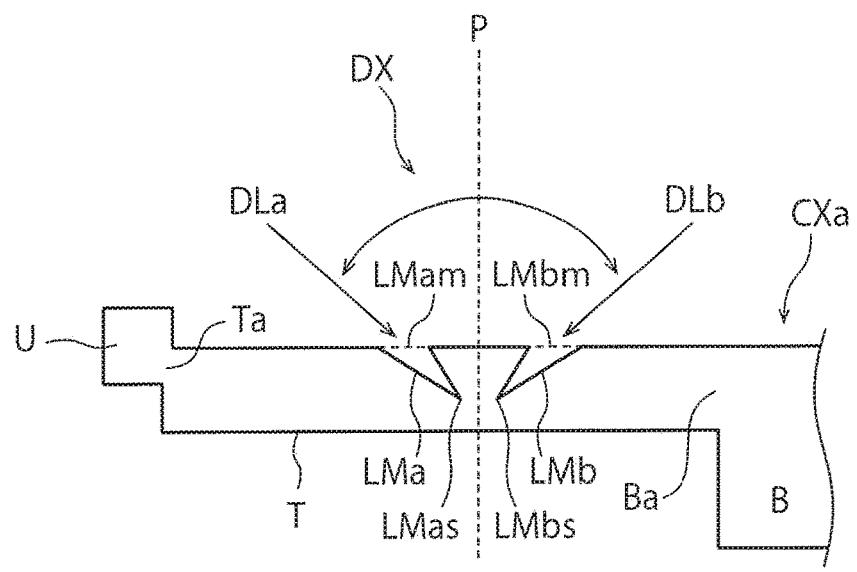
FIG. 13 is a cross-sectional view of the die pad frame DF, illustrating an example of a process of forming first and second laser grooves LMa and LMb on the upper surface of the projection T of the die pad frame DF by laser irradiation.
Figure 14:
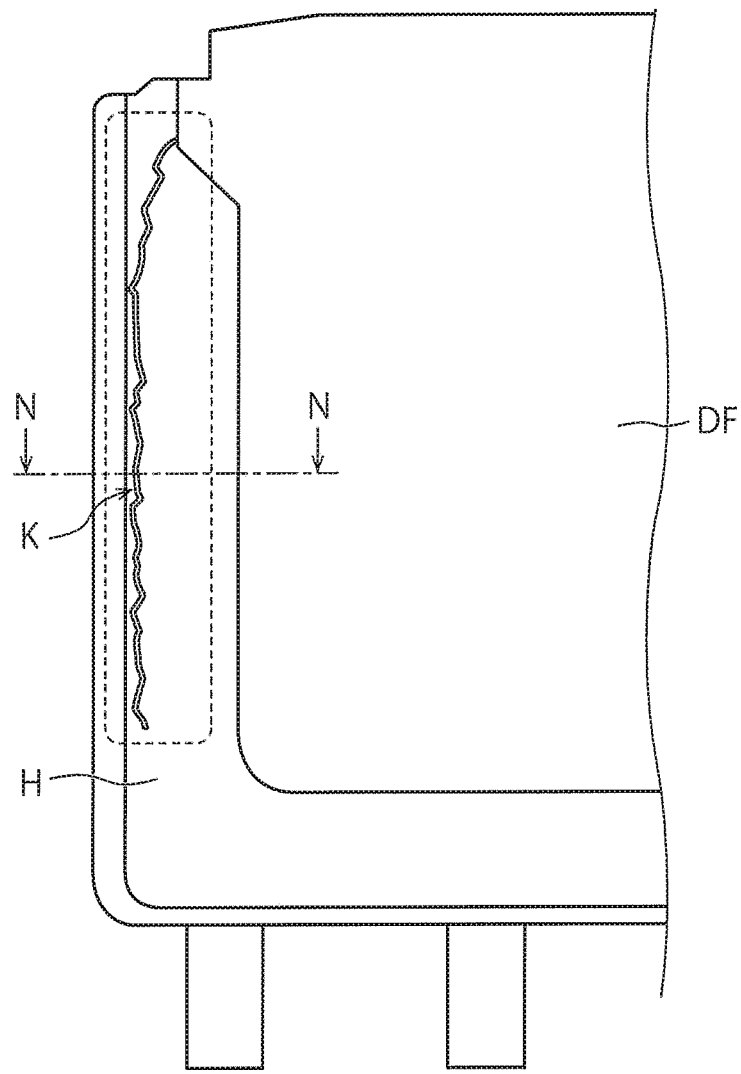
FIG. 14 is a top view illustrating an example of an appearance of the conventional semiconductor module.
Figure 15:
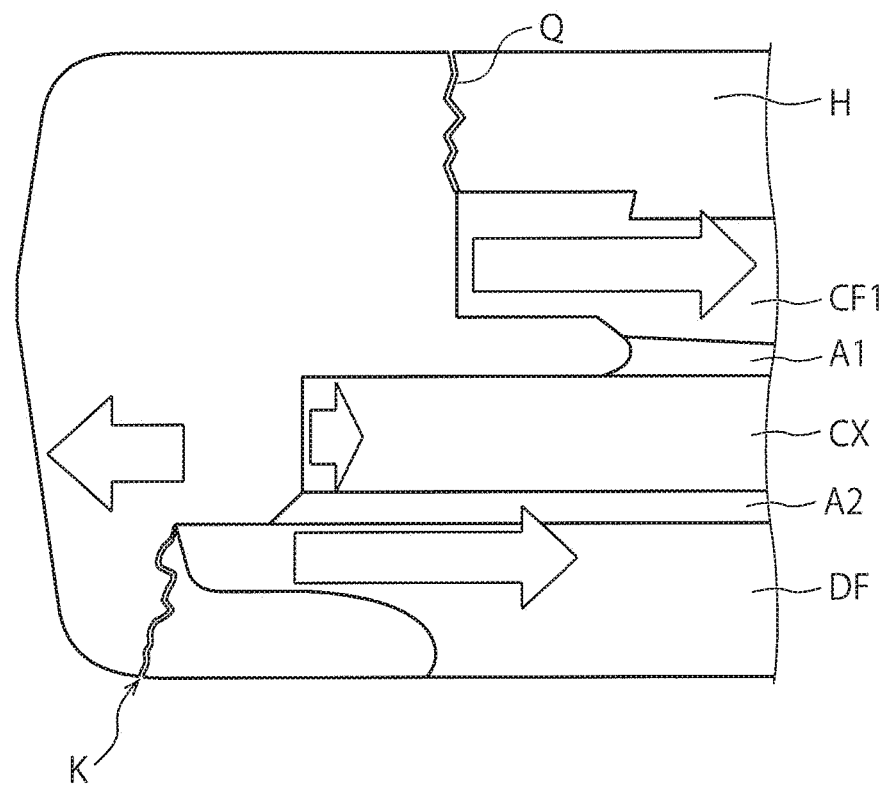
FIG. 15 is a cross-sectional view illustrating an example of a cross section of the conventional semiconductor module shown in FIG. 14 taken along line N-N.

FIG. 9 is a cross-sectional view illustrating an example of a cross section of a semiconductor module according to a second embodiment. FIG. 10 is a cross-sectional view illustrating another example of the cross section of the semiconductor module according to the second embodiment. FIG. 11 is a top view illustrating an example of a configuration on an upper surface of a die pad frame DF included in the semiconductor module according to the second embodiment. FIG. 12 is a cross-sectional view of the die pad frame DF, illustrating an example of a process of forming a laser groove LM on the upper surface of the projection T of the die pad frame DF by laser irradiation. FIG. 13 is a cross-sectional view of the die pad frame DF, illustrating an example of a process of forming first and second laser grooves LMa and LMb on the upper surface of the projection T of the die pad frame DF by laser irradiation.

The cross sections of the semiconductor module shown in FIGS. 9 and 10 are obtained by providing additional grooves to the cross section of the first embodiment taken along line N-N of FIG. 6.

The die pad frame DF of the semiconductor module according to the second embodiment shown in FIG. 11 may be applied to the semiconductor module 100 according to the first embodiment shown in FIGS. 1 to 6.

As shown in FIGS. 9 to 11 for example, one or more laser grooves LM (LM1, LM2, LM3) are formed by laser irradiation on the upper surface of the projection T of the die pad frame DF along the end Ba of the main body B of the die pad frame DF.

The cross section of the laser grooves LM in a direction perpendicular to the direction along which the laser grooves LM extend on the upper surface of the projection T (for example, the first direction D1 shown in FIGS. 9 and 10) has a V shape.

However, the cross section of the laser grooves LM in a direction perpendicular to the direction along which the laser grooves LM extend on the upper surface of the projection T (for example, the first direction D1 shown in FIGS. 9 and 10) may have a U shape.

The die pad frame DF has a first side DF1, a second side DF2, one end of which intersects one end of the first side DF1, a third side DF3, one end of which intersects the other end of the first side DF1, and a fourth side DF, one end of which intersects the other end of the second side DF2 and the other end of which intersects the other end of the third side DF3, as shown in FIG. 11, for example.

The die pad frame DF thus has a substantially rectangular shape as in the first embodiment.

The projection T and the locking portion U are disposed in a region along the first, second, and third sides DF1, DF2, and DF3, but not disposed in a region along the fourth side DF4, as shown in FIG. 11.

A through-hole Z is disposed in the region of the upper surface of the die pad frame DF along the fourth side DF4 as shown in FIG. 11, the through-hole Z penetrating the main body B and being intended to improve the adhesion of the die pad frame DF with the sealing resin H.

In the second embodiment, the laser grooves LM (LM1, LM2, LM3) are formed by laser irradiation on the upper surface of the projection T along the first, second, and the third side DF1, DF2, DF3 of the die pad frame DF, as shown in FIG. 11.

Also in the second embodiment, additional laser grooves LM4a, LM4b, LM4c, and LM4d are formed by laser irradiation along the fourth side DF4 between the region where the through-hole Z is formed and the chip region CX, as shown in FIG. 11.

Although the example shown in FIG. 11 includes four additional laser grooves, the number of additional laser grooves may be one to three, or five or more.

The laser grooves LM1, LM2, LM3 are sequentially disposed along the first, second, and third sides DF1, DF2, and DF3 of the die pad frame DF as shown in FIG. 11, for example.

The number of additional laser grooves LM4a, LM4b, LM4c, and LM4d (four in FIG. 11) is set to be larger than the number of lines formed by sequentially disposed laser grooves LM1, LM2, and LM3 (one in FIG. 11).

As shown in FIG. 11, for example, the line formed by the sequentially disposed laser grooves LM1, LM2, and LM3 is connected to the additional laser groove LM4a so as to surround the perimeter of the chip region CXa of the die pad frame DF where the semiconductor chip CX id disposed.

As in the first embodiment, the conductive metal material of the die pad frame DF is a copper (Cu)-based alloy or a copper (Cu)-based alloy to which a different metal such as Sn, Zn, Fe, Cr, or Ni is added. Although the surface of the die pad frame DF is not plated, it may be plated if necessary.

This enables the die pad frame DF to be formed easily.

As shown in FIG. 12, for example, when the laser grooves LM are formed, the direction of laser irradiation DL relative to a groove region DX on the upper surface of the projection T where the laser grooves LM are formed is set to be parallel to a perpendicular line P passing through the groove region DX on the upper surface of the projection T.

As a result, the cross section of the laser grooves LM substantially have a V shape in which the bottom is located on the center of the width of the laser groove LM (for example, the width in the second direction D2).

The laser irradiation roughens the inner surfaces and the edge portions of the laser grooves LM. The roughness prevents the conductive connection member for die pad A2 from spreading by getting wet on the upper surface of the die pad frame DF.

As shown in FIG. 13, for example, the bottom LMas of a first laser groove LMa among the laser grooves LM may be located to be closer to the chip region CXa where the semiconductor chip CX is disposed than the center LMam in the width of the first laser groove LMa (for example, the width in the second direction D2).

The mold lock of the sealing resin H may be performed more reliably in this manner.

The direction DLa of the laser irradiation relative to the groove region DX on the upper surface of the projection T to form the first laser groove LMa in the above-described manner is slanted from the perpendicular line P that passes through the groove region DX on the upper surface of the projection T toward the locking portion U, as shown in FIG. 13, for example.

This allows the first laser groove LMa to be formed so that the bottom LMas is closer to the chip region CXa than the center LMam in the width of the first laser groove LMa (for example, the width in the second direction D2).

Furthermore, as shown in FIG. 13, for example, the bottom LMbs of a second laser groove LMb among the laser grooves LM may be located to be closer to the locking portion U than to the center LMbm of the width of the second laser groove LMb (for example, the width in the second direction D2).

This may block the flow of the conductive connection member for die pad A2 more reliably, for example.

The direction DLb of the laser irradiation relative to the groove region DX on the upper surface of the projection T to form the second laser groove LMb in the above-described manner is slated from the perpendicular line P that passes through the groove region DX on the upper surface of the projection T toward the chip region CXa where the semiconductor chip CX is disposed, as shown in FIG. 13, for example.

This allows the second laser groove LMb to be formed so that the bottom LMbs is closer to the locking portion U than the center LMbm in the width of the second laser groove LMb (for example, the width in the second direction D2).

The other members of the semiconductor module according to the second embodiment are the same as those of the first embodiment.

Thus, the semiconductor module according to the second embodiment is capable of improving the insulation between the semiconductor chip and the clip frame disposed on the semiconductor chip in a region near the end of the clip frame, while preventing the sealing resin from cracking or separating.

Furthermore, the semiconductor module according to the second embodiment is capable of preventing the flow of a conductive connection member that electrically connects the semiconductor chip and the die pad frame in a region at the end of the die pad frame, while preventing the occurrence of a crack or separation of the sealing resin at an end portion of the die pad frame.

Third Embodiment

In the first embodiment, the semiconductor chip CX is an MOSFET. However, other semiconductor elements may also be used.

Specifically, the semiconductor chip CX may be a diode, an insulated gate bipolar transistor (IGBT), or other FETs.

The other elements of the semiconductor module according to the third embodiment are the same as those of the first embodiment or the second embodiment.

Thus, the semiconductor module according to the third embodiment is capable of improving the insulation between the semiconductor chip and the clip frame disposed on the semiconductor chip in a region near the end of the clip frame, while preventing the sealing resin from cracking or separating.

Furthermore, the semiconductor module according to the third embodiment is capable of preventing the flow of the conductive connection member that electrically connects the semiconductor chip and the die pad frame in a region at the end of the die pad frame, while preventing the occurrence of a crack or separation of the sealing resin at an end portion of the die pad frame.

A semiconductor module in an aspect of the present invention includes:
a die pad frame;
a semiconductor chip disposed in a chip region on an upper surface of the die pad frame, the semiconductor chip having an upper surface on which a first electrode is disposed and a lower surface on which a second electrode is disposed;
a conductive connection member for die pad disposed between the second electrode of the semiconductor chip and an upper surface of the die pad frame, the conductive connection member for die pad electrically connecting the second electrode of the semiconductor chip and the upper surface of the die pad frame;
a first clip frame disposed on the upper surface of the semiconductor chip;
a first clip conductive connection member disposed between the first electrode on the semiconductor chip and a lower surface of the first clip frame, the first clip conductive connection member electrically connecting the first electrode of the semiconductor chip and the lower surface of the first dip frame; and
a sealing resin for sealing the semiconductor chip, the die pad frame, the first clip frame, the first clip conductive connection member, and the conductive connection member for die pad.

A clip locking part is disposed at an end portion of an upper surface of the first clip frame, the clip locking part being partially above the upper surface of the first clip frame so as to be away from the upper surface of the semiconductor chip.

A groove is formed on a lower surface of the clip locking part.

Since the end portion of the first clip frame is separated from the semiconductor chip, the end portion of the first clip frame may be sufficiently insulated with respect to the semiconductor chip.

In a region near the clip locking part at the end portion of the first clip frame, the groove of the clip locking part prevents the sealing resin from shrinking, and in turn prevents the occurrence of a crack or a separation to the sealing resin.

Thus, the semiconductor module according to the present invention is capable of improving the insulation between the semiconductor chip and the clip frame disposed on the semiconductor chip in a region near the end portion or the clip frame, while preventing the sealing resin from cracking or separating.

While certain embodiments have been described, these embodiments have been presented by way of example only, and are not intended to limit the scope of the inventions. The embodiments may be embodied in a variety of other forms. Furthermore, various omissions, substitutions and changes in the form of the methods and systems described herein may be made without departing from the spirit of the inventions. The embodiments and their modifications are included in the scope and the subject matter of the invention, and at the same time included in the scope of the claimed inventions and their equivalents.

EXPLANATION OF REFERENCES

100: semiconductor module
DF: die pad frame (lead frame)
CX: semiconductor chip
A2: conductive connection member for die pad
H: sealing resin
CF1: first clip frame
A1: first clip conductive connection member
CF2: second clip frame
A3: second clip conductive connection member
DF1: first side DF2: second side
DF3: third side
DF4: fourth side
T: protrusion
B: main body
LM: laser groove
LM1, LM2, LM3: laser groove
LM4a, LM4b, LM4c, LM4d: additional laser groove

The invention claimed is:

1. A semiconductor module comprising:
a die pad frame;
a semiconductor chip disposed in a chip region on an upper surface of the die pad frame, the semiconductor chip having an upper surface on which a first electrode is disposed and a lower surface on which a second electrode is disposed;
a conductive connection member for a die pad disposed between the second electrode of the semiconductor chip and the upper surface of the die pad frame, the conductive connection member for the die pad electrically connecting the second electrode of the semiconductor chip and the upper surface of the die pad frame;
a first clip frame disposed on the upper surface of the semiconductor chip;
a first clip conductive connection member disposed between the first electrode on the semiconductor chip and a lower surface of the first clip frame, the first clip conductive connection member electrically connecting the first electrode of the semiconductor chip and the lower surface of the first clip frame; and
a sealing resin for sealing the semiconductor chip, the die pad frame, the first clip frame, the first clip conductive connection member, and the conductive connection member for the die pad,
wherein a clip locking part is disposed at an end portion of an upper surface of the first clip frame, the clip locking part being partially above the upper surface of the first clip frame so as to be away from the upper surface of the semiconductor chip,
wherein a groove is formed on a lower surface of the clip locking part,
wherein the die pad frame has a protrusion disposed on an upper side of an end portion of a main body of the die pad frame and protruding from an upper surface of the main body of the die pad frame in a direction parallel to a direction in which the upper surface of the main body of the die pad frame extends, the protrusion improving adhesion with the sealing resin,
wherein a locking portion is disposed on a tip portion of the protrusion, the locking portion being partially above an upper surface of the protrusion, and
wherein the protrusion of the die pad frame has one or more laser grooves on the upper surface of the protrusion, the one or more grooves being formed by laser irradiation so as to extend along the end portion of the main body of the die pad frame.

2. The semiconductor module according to claim 1,
wherein the one or more laser grooves on the upper surface of the protrusion have a cross section taken along a direction perpendicular to a length direction along which the one or more laser grooves extend, the cross section having a V shape or a U shape, and
wherein a bottom of a first laser groove among the one or more laser grooves is positioned to be closer to a chip region where the semiconductor chip is disposed than a center of a width of the first laser groove.

3. The semiconductor module according to claim 2, wherein a direction of the laser irradiation relative to a groove region of the upper surface of the protrusion where the first laser groove is formed is slanted from a perpendicular line passing through the groove region of the upper surface of the projection toward the locking portion.

4. The semiconductor module according to claim 1,
wherein the one or more laser grooves on the upper surface of the protrusion have a cross section taken along a direction perpendicular to a length direction in which the one or more the laser grooves extend, the cross section having a V shape or a U shape, and
wherein a bottom of a second laser groove among the one or more laser groove is positioned to be closer to the locking portion than a center of a width of the second laser groove.

5. The semiconductor module according to claim 4, wherein a direction of the laser irradiation relative to a groove region of the upper surface of the protrusion where the second laser groove is formed is slanted from a perpendicular line passing through the groove region of the upper surface of the protrusion toward the chip region where the semiconductor chip is disposed.

6. The semiconductor module according to claim 1, wherein the laser irradiation roughens inner surfaces and edge portions of the one or more laser grooves to prevent the conductive connection member for the die pad on the upper surface of the die pad frame from spreading by getting wet.

7. The semiconductor module according to claim 1,
wherein the die pad frame has a first side, a second side, one end of which intersects one end of the first side, a third side, one end of which intersects another end of the first side, and a fourth side, one end of which intersects another side of the second side and another side of which intersects another end of the third side,
wherein the protrusion and the locking portion are formed in a region along the first side, the second side, and the third side, and not formed in a region along the fourth side,
wherein the region along the fourth side of the upper surface of the die pad frame has a through-hole passing through the main body and improving adhesion with the sealing resin,
wherein the one or more laser grooves are formed by the laser irradiation on the upper surface of the protrusion along the first side, the second side, and the third side of the die pad frame, and
wherein one or more additional laser grooves are formed by laser irradiation along the fourth side between the region where the through-hole is formed and the chip region.

8. The semiconductor module according to claim 7,
wherein the one or more laser grooves are sequentially disposed along the first side, the second side, and the third side of the die pad frame, and
wherein the number of additional laser grooves is greater than the number of lines formed by the one or more laser grooves.

9. The semiconductor module according to claim 7, wherein the one or more laser grooves are in communication with the one or more additional laser groove to surround a perimeter of the chip region of the die pad frame where the semiconductor chip is disposed.

10. The semiconductor module according to claim 1, wherein a conductive metal material of the die pad frame is a copper-based alloy or a copper-based alloy to which a different metal selected from Sn, Zn, Fe, Cr, and Ni is added, and wherein a surface of the die pad frame are not plated.

* * * * *